US009948311B1

(12) United States Patent
Nguyen (10) Patent No.: US 9,948,311 B1
(45) Date of Patent: Apr. 17, 2018

(54) DECISION-DIRECTED PHASE DETECTOR

(71) Applicant: Finisar Corporation, Sunnyvale, CA (US)

(72) Inventor: The'Linh Nguyen, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 15/420,764

(22) Filed: Jan. 31, 2017

(51) Int. Cl.
| | |
|---|---|
| *H03L 7/06* | (2006.01) |
| *H03L 7/085* | (2006.01) |
| *H03L 7/08* | (2006.01) |
| *H04L 7/02* | (2006.01) |

(52) U.S. Cl.
CPC .......... *H03L 7/085* (2013.01); *H03L 7/0807* (2013.01); *H04L 7/02* (2013.01)

(58) Field of Classification Search
USPC ................................. 327/147–149, 156–158
See application file for complete search history.

(56) References Cited

U.S. PATENT DOCUMENTS

| | | | | |
|---|---|---|---|---|
| 3,593,167 A * | 7/1971 | Koulopoulos | ..... | G11B 20/1419 327/156 |
| 4,686,458 A * | 8/1987 | Beyerbach | ................ | H03F 3/58 324/76.47 |
| 2011/0279156 A1 * | 11/2011 | Abbasi | .................. | H03L 7/0891 327/158 |
| 2011/0304365 A1 * | 12/2011 | Bunch | ................... | H03L 7/1976 327/157 |
| 2012/0274372 A1 * | 11/2012 | Nilsson | ................. | H03L 7/0891 327/157 |
| 2014/0055179 A1 * | 2/2014 | Gong | ...................... | H03L 7/081 327/156 |
| 2015/0008961 A1 * | 1/2015 | Kim | ........................ | H03L 7/085 327/12 |
| 2015/0222276 A1 * | 8/2015 | Milijevic | ................ | H03L 7/087 327/147 |
| 2016/0079990 A1 * | 3/2016 | Stanton | .................... | H03K 5/24 327/158 |
| 2016/0164527 A1 * | 6/2016 | Song | ..................... | H03L 7/0814 327/158 |
| 2016/0182067 A1 * | 6/2016 | Liu | ......................... | H03L 7/091 327/158 |
| 2017/0230167 A1 * | 8/2017 | Kaneda | ................. | H04L 7/0075 |

* cited by examiner

*Primary Examiner* — Adam Houston
(74) *Attorney, Agent, or Firm* — Maschoff Brennan (57) ABSTRACT

A decision-directed phase detector (DDPD) to compare an input signal including clock and data components with a reference signal set to a clock crossover value, and generate a first compared output signal designating a transition of the input signal through the clock crossover value. The DDPD may also receive the first compared output signal and generate a phase adjustment signal, and compare the input signal with the reference signal set to a positive offset clock crossover value of the clock crossover value offset by a positive offset value, and generate a positive offset compared output signal designating a transition of the input signal through the positive offset clock crossover value. The DDPD may further generate a valid transition signal to route the phase adjustment signal to a clock generation circuit when the positive offset compared output signal transitions over a clock period.

20 Claims, 5 Drawing Sheets

DECISION-DIRECTED PHASE DETECTOR

TECHNICAL FIELD

Embodiments described herein generally relate to receivers and, more particularly, to phase detection and clock recovery prior to equalization of a signal.

BACKGROUND

Clock and data recovery (CDR) circuits may be implemented to allow a system to generate a clock signal, based on a received data signal that is synchronized with the received data signal. CDR circuits may be implemented using analog or digital components.

The received data signals may include a significant amount of interference causing the data signal to jitter. A clock and data recovery circuit may include a phase detector which may not lock or lock with high amount of jitter on the data signal. If the phase detector is not able to lock on the signal, then any extracted clock signal may be corrupted causing data recovery to be severely impacted.

The subject matter claimed herein is not limited to embodiments that solve any disadvantages or that operate only in environments such as those described above. Rather, this background is only provided to illustrate one example technology area where some embodiments described herein may be practiced.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION

Reference will now be made to the figures wherein like structures will be provided with like reference designations. It is understood that the drawings are diagrammatic and schematic representations of exemplary embodiments of the invention, and are not limiting of the present invention nor are they necessarily drawn to scale. As used herein, a signal on a conductor may simply be referred to as the "signal" rather than the signal on a conductor or node.

In general, embodiments of the present invention relate to discriminating between transitions that fail to traverse substantially the entire signal swing. More specifically, the various embodiments allow phase detection and clock recovery to be done before equalization, allowing the phase detection to be performed outside of the equalizer. The various embodiments provide improvements for both locking robustness and low jitter in locked condition. The phase detector described herein discriminates transitions that don't make it to the full height, such as the transitions that cross far away from the ideal crossing time.

In one embodiment, a decision-directed phase detector (DDPD) includes a first comparator configured to compare an input signal including clock and data components with a reference signal set to a clock crossover value, and to generate a first compared output signal designating a transition of the input signal through the clock crossover value. The DDPD also includes a phase detector configured to receive the first compared output signal and generate a phase adjustment signal. The DDPD further includes a second comparator configured to compare the input signal with the reference signal set to a positive offset clock crossover value of the clock crossover value offset by a positive offset value, and to generate a positive offset compared output signal designating a transition of the input signal through the positive offset clock crossover value. The DDPD yet further includes a transition detection circuit to generate a valid transition signal to route the phase adjustment signal to a clock generation circuit when the positive offset compare output signal transitions over a clock period.

In another embodiment, a method includes comparing an input signal including clock and data components with a reference signal set to a clock crossover value, and generating a first compared output signal designating a transition of the input signal through the clock crossover value. The method also includes receiving the first compared output signal and generating a phase adjustment signal. The method further includes comparing the input signal with the reference signal set to a positive offset clock crossover value of the clock crossover value offset by a positive offset value, and generating a positive offset compared output signal designating a transition of the input signal through the positive offset clock crossover value. The method yet further includes generating a valid transition signal to route the phase adjustment signal to a clock generation circuit when the positive offset compare output signal transitions over a clock period.

In yet another embodiment, a DDPD includes a means for comparing an input signal including clock and data components with a reference signal set to a clock crossover value, and means for generating a first compared output signal designating a transition of the input signal through the clock crossover value. The DDPD also includes a means for receiving the first compared output signal and means for generating a phase adjustment signal. The DDPD further includes a means for comparing the input signal with the reference signal set to a positive offset clock crossover value of the clock crossover value offset by a positive offset value, and means for generating a positive offset compared output signal designating a transition of the input signal through the positive offset clock crossover value. The DDPD yet further includes a means for generating a valid transition signal to route the phase adjustment signal to a clock generation circuit when the positive offset compare output signal transitions over a clock period.

Figure 1:
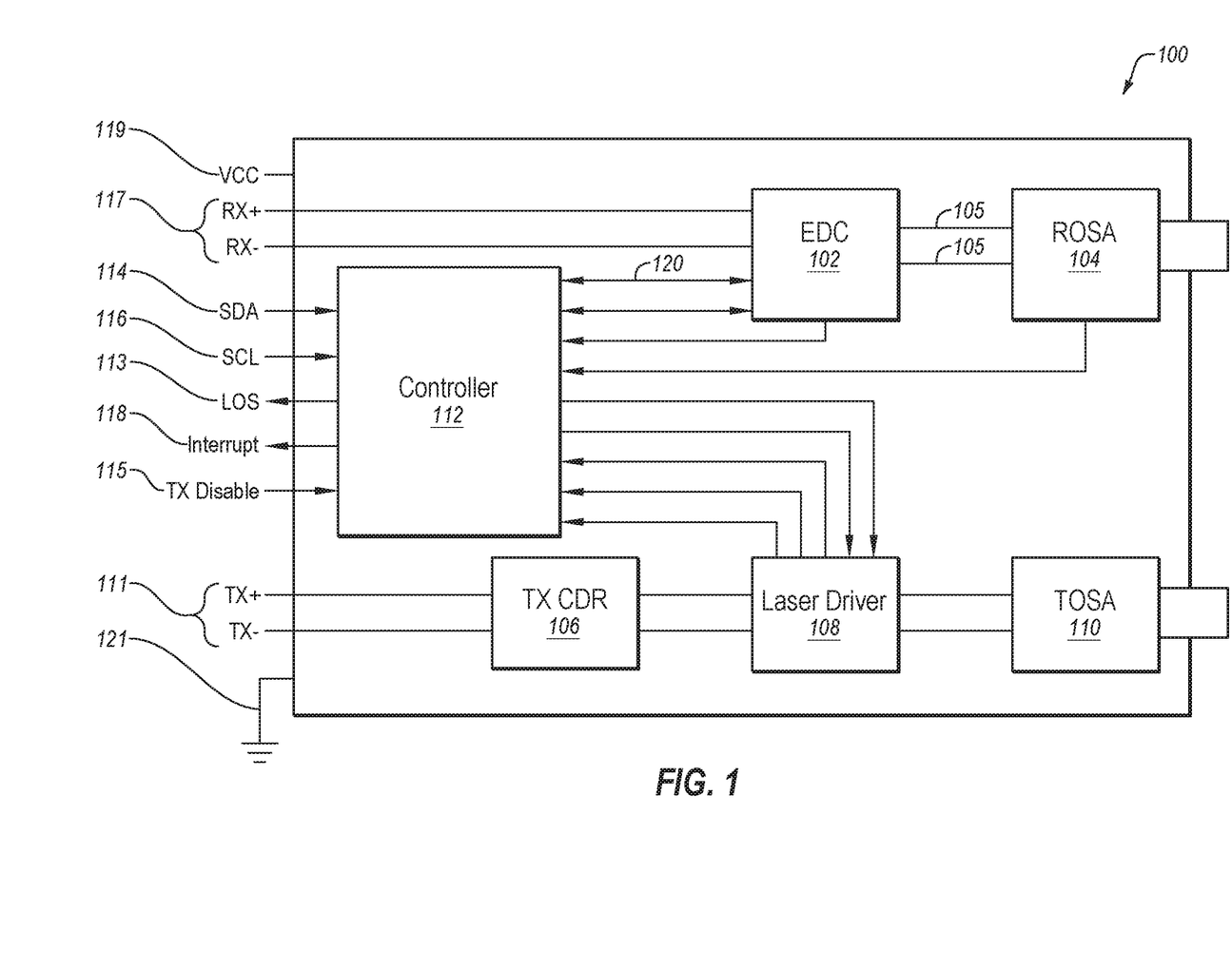
FIG. 1 is a schematic illustration of a transceiver module according to one embodiment of the present invention.

FIG. 1 is a schematic illustration of a transceiver module according to one embodiment of the present invention. In this example, the transceiver 100 is of the XFP form factor, and is designed to support a decision-directed phase detector for unequalized digital transmission over multimode fiber using an electronic dispersion compensation (EDC) circuit 102 connected to a receiver optical subassembly (ROSA) 104 in the receive path via data lines 105. The ROSA 104 can incorporate a linear response transimpedance amplifier (TIA—not shown) which is desirable to provide a usable signal to the EDC circuit 102. A limiting amplifier of the type commonly used in unequalized links may destroy much of the information the EDC circuitry relies on to recover the transmitted signal. The transmit path of the transceiver consists of a transmit Clock Data Recovery (CDR) circuit 106, a laser driver 108 and a transmitter optical subassembly (TOSA) 110. During normal operation, the CDR 106 can receive differential transmission signals TX+ and TX− from differential transmission terminals 111, and transmit the signals to the laser driver 108, which can condition the differential signals for proper optical transmission using TOSA 110.

The EDC circuit 102 in this case, may also incorporate the retiming function for the receive path, so no external receive CDR is required. The EDC circuit 102 can generate differential receive output signals RX+ and RX− on differential receive terminals 117 based on optical signals received by ROSA 104. The transceiver 100 can also have voltage supplies such as, for example, Vcc provided on terminal 119, and ground provided on terminal 121.

The transceiver 100 also contains a controller 112, which is used for a number of functions. These include setup, control and temperature compensation of various elements of the transmit and receive paths, and implementation of diagnostic functions. In this embodiment, the controller 112 may be further connected to the host system through a 2-wire serial interface that includes a clock line 116 (SCL) and data line 114 (SDA). Additionally, an interrupt pin, 118, as defined in the XFP MSA standard, can also be connected to the host system.

The controller 112 can also handle all low speed communications with the end user. These low speed communications concern, among other things, the standardized pin functions such as a Loss of Signal (LOS) 113, and the Transmitter Disable Input (TX DISABLE) 115, also sometimes referred to as "TXD." The LOS indicator 113 is set to assert a digital signal when the received power at the transceiver falls below a predetermined limit indicating that it is likely that the received data is not usable.

The controller 112 may be connected by a serial data path 120 to the EDC circuit 102. The EDC circuit 102 may be designed such that the current state of the EDC equalizer tap weights can be reported on this serial connection 120 as digital values. The controller 112 may then perform a number of calculations with this data. In the simplest form, one calculation compares the tap weights with the known limits of those values for this EDC circuit 102, and determines how close the circuit 102 is to the limits of its equalization capability.

Figure 2:
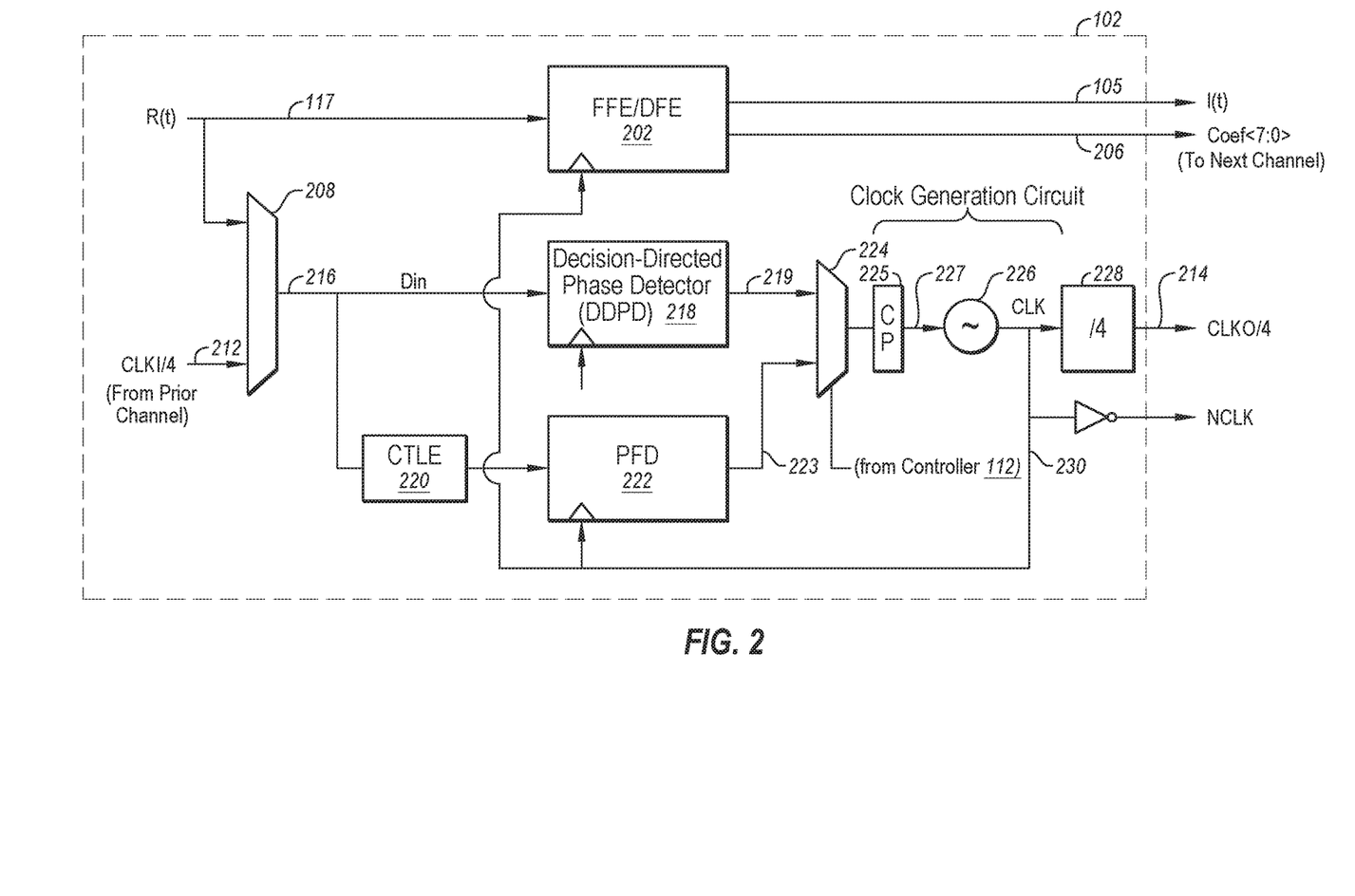
FIG. 2 is a block diagram of an Electronic Dispersion Compensation (EDC) circuit, in accordance with exemplary embodiments.

FIG. 2 is a block diagram of an EDC 102, in which some embodiments described herein may be implemented. The EDC 102 may include a feed-forward equalization (FFE) and/or decision feedback equalization (DFE). An equalizer including both FFE and DFE may be referred to as an FFE/DFE equalizer 202. The FFE/DFE equalizer 202 may further implement a least mean square (LMS) algorithm for adapting the equalizer to the channel to equalize digital data signals communicated in the optical system. Specifically, the FFE/DFE equalizer 202 may correct inter-symbol interference (ISI) in the electrical signals such as ISI resulting from multimode dispersion in multimode fibers.

The LMS algorithm may operate by iteratively implementing and evaluating equalization tap coefficients (tap coefficients) until an optimum set of tap coefficients is discovered. The optimization of the tap coefficients may be based on a transfer function. The LMS algorithm may self-adjust the transfer function based on a gradient of mean square error between a desired signal and the actual signal output by the FFE/DFE equalizer 202. In the optical system, the FFE/DFE equalizer 202 may continuously update the tap coefficients based on received digital data signals to adapt for time varying channels.

The EDC circuit 102 may also include a multiplexer 208, a decision-directed phase detector 218, a phase frequency detector (PFD) 222, a multiplexer 224, a charge pump (CP) 225, and a voltage controlled oscillator (VCO) 226. The multiplexer 208 may be coupled to an input data signal 117. The EDC circuit 102 may receive the input data signal 117 and generate an output clock signal 105 to a driver circuit (not shown). To generate the output clock signal 105, the EDC circuit 102 may lock to a data rate of the input data signal 117.

To lock to the data rate of the input data signal 117, the VCO 226 may first generate a clock signal with a predetermined frequency. The predetermined frequency of the clock signal may be set in the VCO 226 by the controller 112 of FIG. 1. In some embodiments, the predetermined frequency of the clock signal may be based on the data rate of a previously received data signal. The data rate of the previously received data signal may be stored in a memory within or associated with the controller 112. For example, the EDC circuit 102 may achieve a lock on a first data signal and generate a clock signal at a first frequency.

When locking to the data rate of the input data signal 117, the controller 112 enables the PFD 222. The PFD 222, when enabled, compares the frequency of the clock signal from the VCO 226 with the data rate of the input data signal 117. The PFD 222 may output a signal 223, related to the comparison of the frequency of the clock signal with the data rate of the input data signal, to the multiplexer 224. The multiplexer 224 may select the output of the PFD 222 for passing to the CP 225 based on a signal from the controller 112.

The CP 225 receives the signal from the PFD 222 and may adjust a gain of an output voltage generated by the CP 225 based on the comparison of the frequency of the clock signal with the data rate of the input data signal. The output voltage 227 of the CP 225 is sent to the VCO 226 and may cause the VCO 226 to adjust the frequency and/or phase of the clock signal output by the VCO 226.

The controller 112 may determine when the EDC circuit 102 obtains a lock on the input data signal based on detection means (not shown) including, for example, bit error (BER) detection. After a lock on the input data signal is obtained, the controller 112 may disable the PFD 222 and enable the decision-directed phase detector 218. The decision-directed phase detector 218 may output a signal related to the comparison of the frequency of the clock signal with the data rate of the data signal to the multiplexer 224. The multiplexer 224 may select the output of the decision-directed phase detector 218 for passing to the CP 225 based on a signal from the controller 112. In some embodiments, using the PFD 222 to obtain lock and changing to the decision-directed phase detector 218 after obtaining lock to maintain the lock on the data signal may allow for faster locking of the data signal and decreased power consumption of the EDC circuit 102.

The multiplexer 208 may be initially configured to output the input 212 or the input signal 117, depending on the bandwidth of the input signal. For example, if the bandwidth of the input signal is, for example, 11 GHz, then input signal 117 is output and if the bandwidth of the input signal is, for example, 6 GHz, then input signal 212 is output. The output signal 216 is sent to the PFD 222 for frequency acquisition and the multiplexer 224 outputs signal 223. Once frequency acquisition is completed, the multiplexer 224 outputs signal 219 to continue the phase alignment process of the input signal 117.

Figure 3:
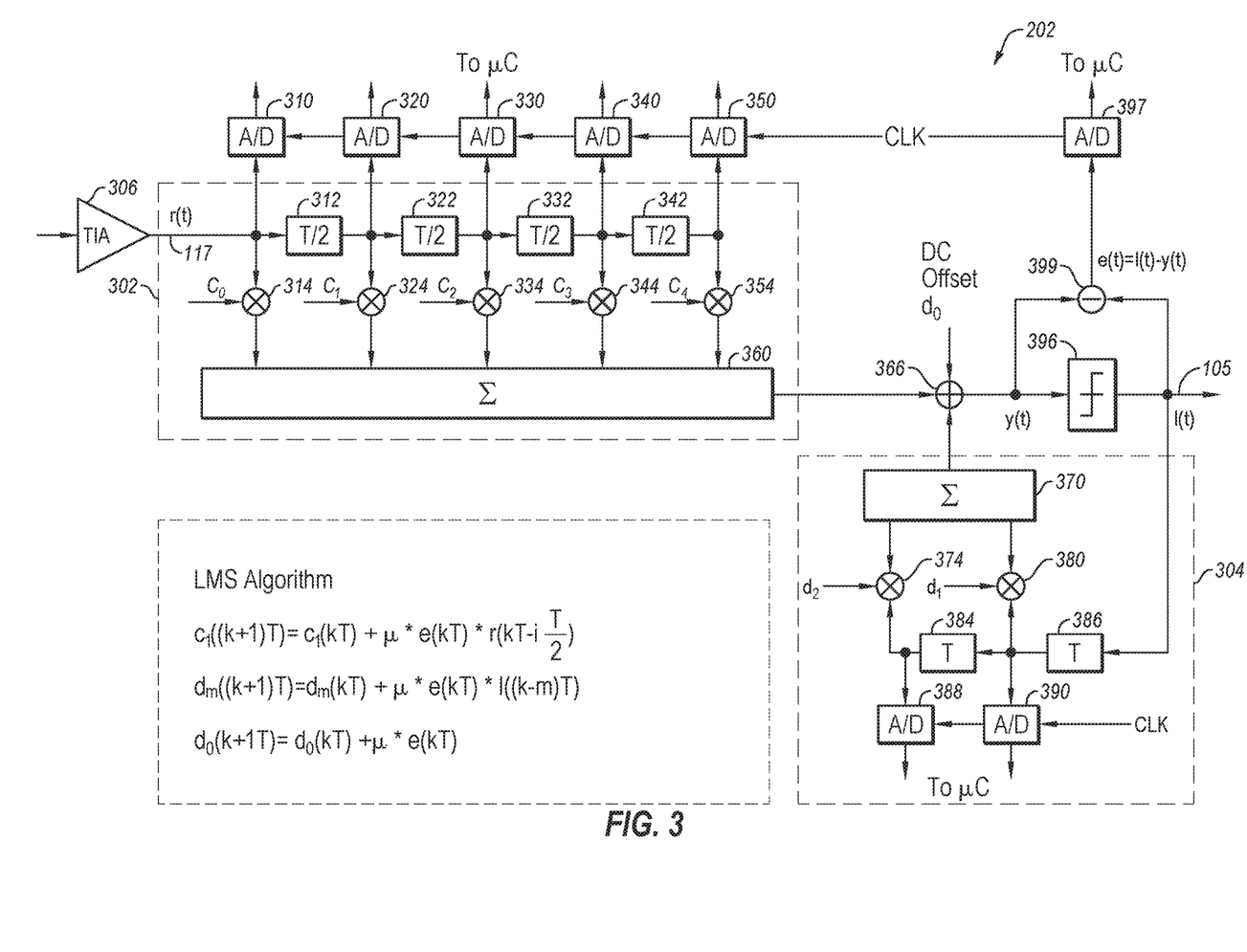
FIG. 3 illustrates a circuit diagram of a feed-forward equalization (FFE) and/or decision feedback equalization (DFE) equalizer (FFE/DFE), in accordance with an exemplary embodiment.

FIG. 3 illustrates a circuit diagram of an FFE/DFE equalizer 202, in which some embodiments described herein may be implemented. The FFE/DFE equalizer 202 may include an FFE 302 and a DFE 304 (collectively, FFE/DFE equalizer 202). The FFE/DFE equalizer 202 is depicted with a slicer 396, and a DD-LMS module 397. The DD-LMS module 397 may be configured for operation consistent with the LMS algorithm. The FFE 302 may be configured to correct a waveform of a data signal received by the FFE 302 at an input. For example, the FFE 302 may receive a signal from the TIA 306. The FFE 302 may use the voltage levels of the received signal associated with previous and current bits to correct the voltage level of the current bit. Specifically, the data signal may be divided into several paths with intervening time delays 312, 322, 332, and 342. Each piece of the data signal may then be involved in a multiplication at one of multiple multiplication stages 314, 324, 334, 344, and 354 with corresponding tap coefficients, $C_0$, $C_1$, $C_2$, $C_3$, and $C_4$.

When multiplied by the separated data signal, the tap coefficients $C_0$, $C_1$, $C_2$, $C_3$, and $C_4$ produce a series of filtered values at the multiplication stages 314, 324, 334, 344, and 354. The filtered values are summed in an FFE summer 360. The filtered values provide M delays and superimposed weighted signals to a second summer 366. The second summer 366 also receives summed resultant values from the DFE 304 (described below). In general, the FFE 302 obtains an equalized voltage level for a bit of interest by forming a sum at the FFE summer 360 of the products of the tap coefficients $C_0$, $C_1$, $C_2$, $C_3$, and $C_4$ and voltage levels of the previous delayed bits as well as the bit of interest before being equalized.

The basic approach of the DFE 304 is to subtract out errors included in previously-decided bits. Thus a decision on a current bit is made based on a current signal bit minus interference on one or more succeeding or forward-looking bits. Accordingly, the DFE 304 may take final bits of data from the data signal. Specifically, the slicer 396 may be configured to "slice off" bits and delay the bits through one or more time delays 384 and 386. The bits are then communicated to multipliers 374 and 380. Tap coefficients $d_1$ and $d_2$ are multiplied by the bits at the multipliers 374 and 380. Resulting values are then summed at a DFE summer 370 and communicated to the second summer 366.

A value exiting the second summer 366 is further communicated to an error stage 399. The error stage 399 receives the value exiting the second summer 366 and a value exiting the slicer 396 to determine an error value ($e_r$). Based on the error value ($e_r$) the DD-LMS adjusts the tap coefficients, $C_0$, $C_1$, $C_2$, $C_3$, and $C_4$ of the FFE 302 and the tap coefficients $d_1$ and $d_2$ of the DFE 304. The tap coefficients $C_0$, $C_1$, $C_2$, $C_3$, and $C_4$ are applied at the multiplication stages 314, 324, 334, 344, and 354 and the multipliers 384 and 386 in successive equalization processes.

In general, the above-described operation of the FFE-DFE equalizer 202 may be referred to as normal operation and may correspond to implementation of a normal operational algorithm. The normal operation may be distinct and/or different from operation of the FFE-DFE equalizer 202 during initiation or start-up.

Figure 4:
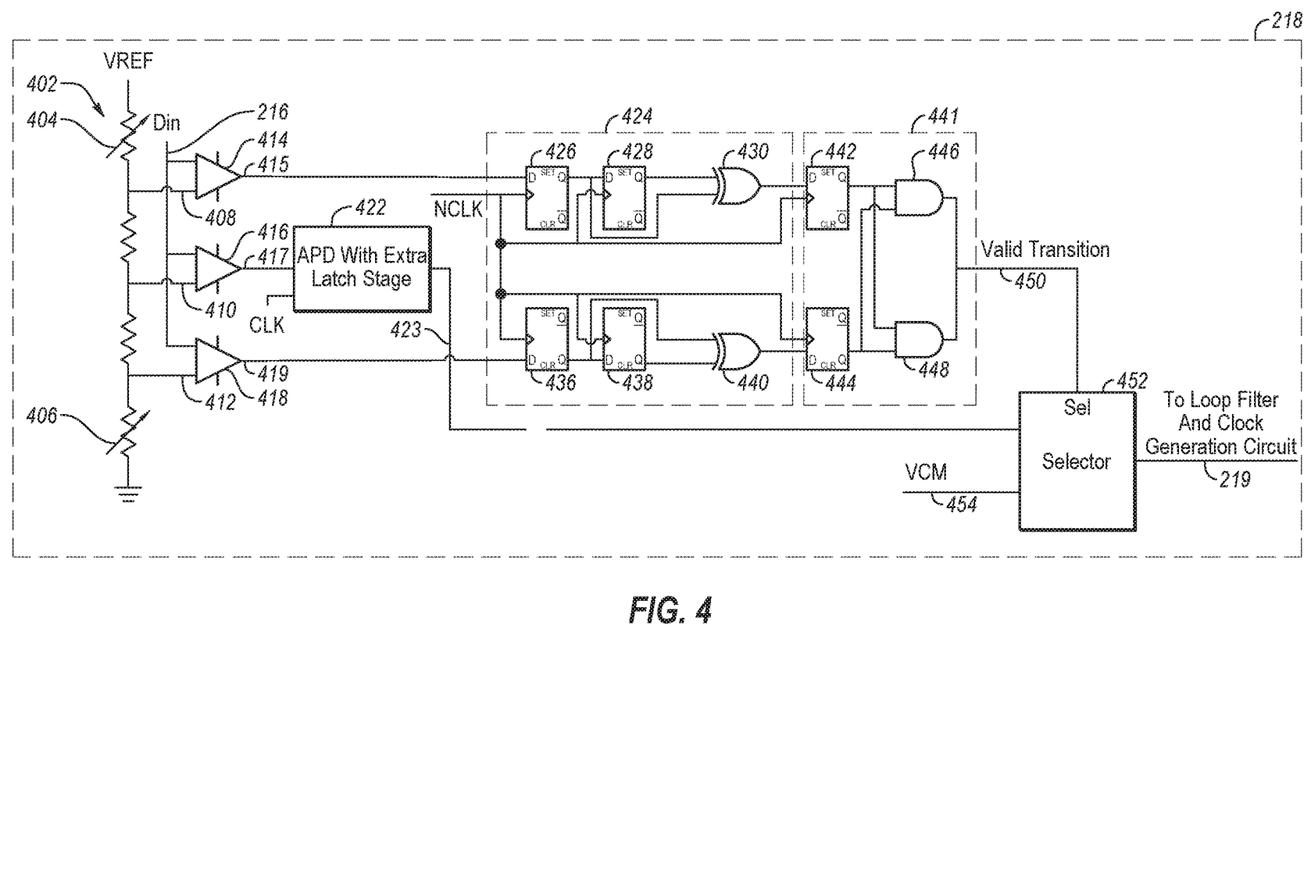
FIG. 4 is a circuit diagram of a Decision-Directed Phase Detector (DDPD), in accordance with an exemplary embodiment.

FIG. 4 is a circuit diagram of a Decision-Directed Phase Detector (DDPD) 218 in which some embodiments described herein may be implemented. The DDPD 218 includes a plurality of comparators 414, 416, and 418. The comparators 414, 416, and 418 each receive the input signal Din 216 and respective divided reference signal 408, 410, and 412. The divided reference signals 408, 410, and 412 are generated from, for example, a voltage divider network 402 receiving an input reference signal Vref. The voltage divider network 402 may include divider values that are adjusted by one or more control signals 404 and 406. Reference voltage 410 corresponds to a zero crossover level of the input signal Din 216. Reference voltage 408 illustrates a positive offset and reference signal 412 exhibits a negative offset with respect to reference voltage 410. Control signals 404 and 406 change the amount of positive and negative offset.

In response to a comparison of the received input signal Din 216 and the respective divided reference signals 408, 410, and 412, the comparators 414, 416, and 418 generate respective comparator outputs 415, 417, and 419. The comparator output 417 may couple to an input of an Alexander phase detector (APD) 422 which may include a conventional configuration with, for example, 7 flip-flops, followed by one or more output flip-flops for synchronizing the output signal 423.

The other comparator outputs 415 and 419 are coupled to a transition detection circuit 424 which verifies transitions in the input signal Din 216 made closer to the outer levels rather than just detecting signals with jitter or other undesirable transient conditions. The transition detection circuit 424 includes a first pair of series configured flip-flops 426 and 428 configured to receive the comparator output 415. This circuit detects transitions close to the top level of Din 216. Further, the transition detection circuit 424 further includes a second pair of series configured flip-flops 436 and 438 configured to receive the comparator output 419. This circuit detects transitions close to the bottom level of Din. The series configured flip-flops 426, 428, 436, and 438 are clocked by an inverted clock signal NCLK.

The transition detection circuit 424 further includes a first exclusive-OR gate 430 with a first input coupling to an output of the flip-flop 426 and a second input coupling to an output of the flip-flop 428 of the first pair of series configured flip-flops. The transition detection circuit 424 further includes a second exclusive-OR gate 440 with a first input coupling to an output of the flip-flop 436 and a second input coupling to an output of the flip-flop 438 of the second pair of series configured flip-flops.

The DDPD 218 further includes a transition validation circuit 441 coupled to the output of the transition detection circuit 424. The transition validation circuit 441 includes a first flip-flop 442 including an input coupled to an output of the exclusive-OR gate 430 and a second flip-flop 444 including an input coupled to an output of the exclusive-OR gate 440. The transition validation circuit 441 further includes a first AND gate 446 including a first input coupled to an output of the first flip-flop 442 and a second input coupled to an output of the second flip-flop 444. The transition validation circuit 441 further includes a second AND gate 448 including a first input coupled to an output of the first flip-flop 442 and a second input coupled to an output of the second flip-flop 444.

The transition validation circuit 441 further couples together an output of the first AND gate 446 with an output of the second AND gate 448 to form a valid transition signal 450. The valid transition signal 450 signifies that the input signal Din 216 transitioned, either positive going or negative going, through both the divided reference signals 408 and 412. The assertion of the valid transition signal 450 reduces triggering on transient signals or signals exhibiting jitter.

The decision-directed phase detector 218 further includes a selector 452 that selects between a first input coupled to the output of the APD 422 or a second input coupled to a common mode voltage signal VCM 454. The selector 452 switches one or the other inputs to an output based on a logic level of the valid transition signal 450. The output of the selector 452 couples to a loop filter (not shown) and passes the output signal 219.

In operation, the DDPD 218 may include an Alexander phase detector with an extra flip-flop (latch) at circuit 422. The DDPD 218 further includes logic or intelligence, such as the transition detection circuit 424, to realize a decision directive. The decision directive is realized by the transition detection circuit 424 in combination with the transition validation circuit 441 to perform a validation of the transition to generate the valid transition signal 450. The valid transition signal 450 then passes to the selector 452 and on to a loop filter or the charge pump 225 of FIG. 2. When the circuit is unable to validate the transition, then the common mode voltage (VCM) 454 passes through the selector 452 to the loop filter or the charge pump 225.

Figure 5:
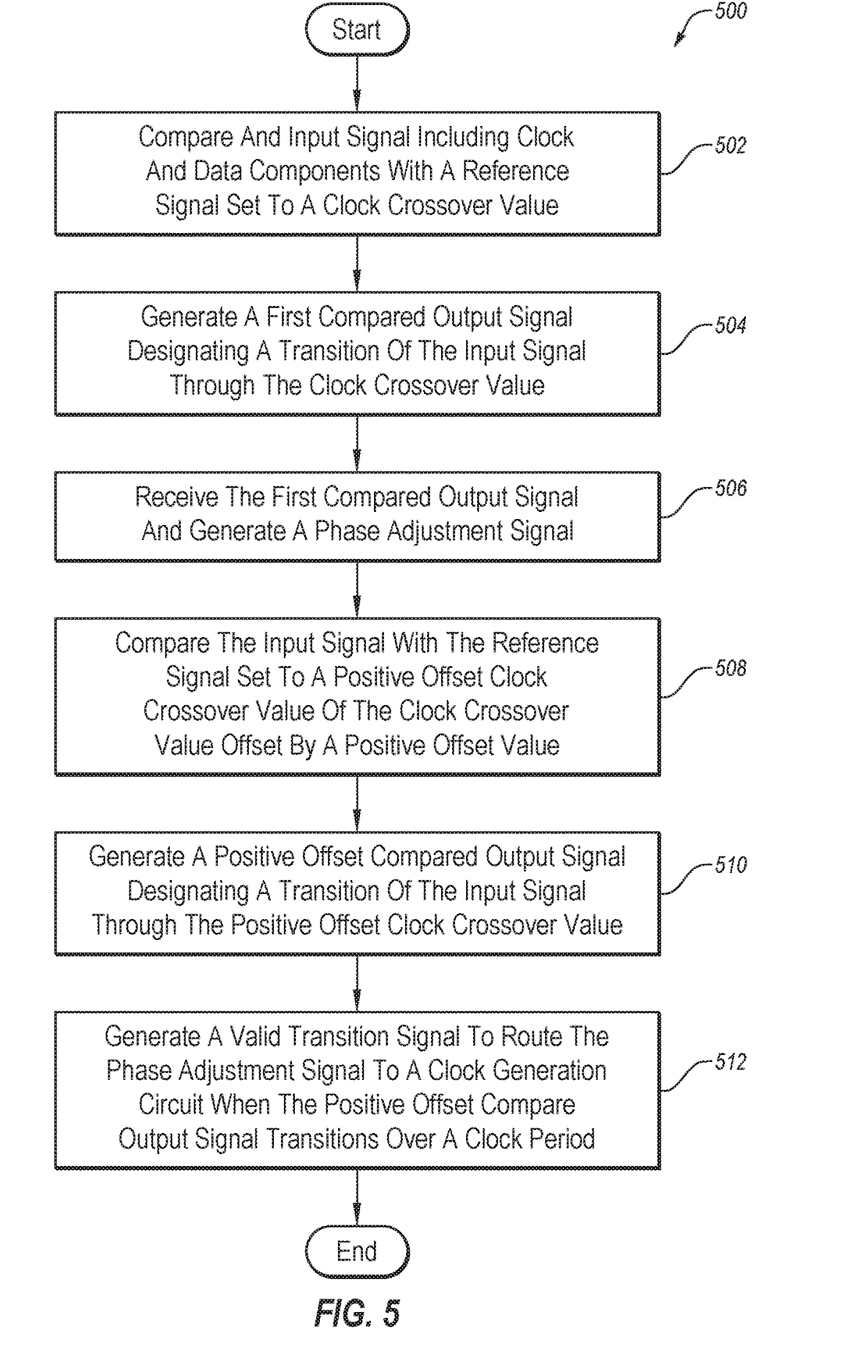
FIG. 5 illustrates a flowchart of a method for discriminating between transitions that fail to traverse substantially the entire signal swing, in accordance with an exemplary embodiment.

FIG. 5 illustrates a flowchart of a method 500 for discriminating between transitions that fail to traverse substantially the entire signal swing. More specifically, the method, and system improves both locking robustness and low jitter in locked conditions.

In block 502, a first comparator or means compares an input signal including clock and data components with a reference signal set to a clock crossover value.

In block 504, the first comparator or means generates a first compared output signal designating a transition of the input signal through the clock crossover value.

In a block 506, a phase detector or means receives the first compared output signal and generates a phase adjustment signal.

In a block 508, a second comparator or means compares the input signal with the reference signal set to a positive offset clock crossover value of the clock crossover value offset by a positive offset value.

In a block 510, the second comparator or means generates a positive offset compared output signal designating a transition of the input signal through the positive offset clock crossover value.

In a block 512, a transition detection circuit or means generates a valid transition signal to route the phase adjustment signal to a clock generation circuit when the positive offset compare output signal transitions over a clock period.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A decision-directed phase detector, comprising:
    a first comparator configured to compare an input signal including clock and data components with a reference signal set to a clock crossover value, and to generate a first compared output signal designating a transition of the input signal through the clock crossover value;
    a phase detector configured to receive the first compared output signal and generate a phase adjustment signal;
    a second comparator configured to compare the input signal with the reference signal set to a positive offset clock crossover value of the clock crossover value offset by a positive offset value, and to generate a positive offset compared output signal designating a transition of the input signal through the positive offset clock crossover value; and
    a transition detection circuit to generate a valid transition signal to route the phase adjustment signal to a clock generation circuit when the positive offset compared output signal transitions over a clock period.

2. The decision-directed phase detector of claim 1, further comprising a third comparator configured to compare the input signal with the reference signal set to a negative offset clock crossover value of the clock crossover value offset by a negative offset value, and to generate a negative offset compared output signal designating a transition of the input signal through the negative offset clock crossover value.

3. The decision-directed phase detector of claim 2, wherein the transition detection circuit is further configured to generate the valid transition signal to route the phase adjustment signal to the clock generation circuit.

4. The decision-directed phase detector of claim 3, further comprising a validation circuit configured to receive both the transition of the positive offset compared output signal and the transition of the negative offset compared output signal over the clock period.

5. The decision-directed phase detector of claim 1, further comprising a selector for passing one of the phase adjustment signal or a common mode input signal to the clock generation circuit based on the valid transition signal.

6. The decision-directed phase detector of claim 1, wherein the phase detector comprises an Alexander phase detector.

7. The decision-directed phase detector of claim 6, further comprising at least one flip-flop coupled to the output of the Alexander phase detector, the at least one flip-flop configured to match delays through the transition detection circuit.

8. A method, comprising:
    comparing an input signal including clock and data components with a reference signal set to a clock crossover value, and generating a first compared output signal designating a transition of the input signal through the clock crossover value;
    receiving the first compared output signal and generating a phase adjustment signal;
    comparing the input signal with the reference signal set to a positive offset clock crossover value of the clock crossover value offset by a positive offset value, and generating a positive offset compared output signal designating a transition of the input signal through the positive offset clock crossover value; and
    generating a valid transition signal to route the phase adjustment signal to a clock generation circuit when the positive offset compared output signal transitions over a clock period.

9. The method of claim 8, further comprising:
    comparing the input signal with the reference signal set to a negative offset clock crossover value of the clock crossover value offset by a negative offset value; and generating a negative offset compared output signal designating a transition of the input signal through the negative offset clock crossover value.

10. The method of claim 9, wherein the generating a valid transition signal further comprises generating the valid transition signal to route the phase adjustment signal to the clock generation circuit.

11. The method of claim 10, further comprising receiving both the transition of the positive offset compared output signal and the transition of the negative offset compared output signal over the clock period.

12. The method of claim 8, further comprising passing one of the phase adjustment signal or a common mode input signal to the clock generation circuit based on the valid transition signal.

13. The method of claim 8, wherein the generating the phase adjustment signal uses an Alexander phase detector.

14. The method of claim 13, further comprising latching an output of the Alexander phase detector to match delays while generating the valid transition signal.

15. A decision-directed phase detector, comprising:
   means for comparing an input signal including clock and data components with a reference signal set to a clock crossover value, and means for generating a first compared output signal designating a transition of the input signal through the clock crossover value;
   means for receiving the first compared output signal and means for generating a phase adjustment signal;
   means for comparing the input signal with the reference signal set to a positive offset clock crossover value of the clock crossover value offset by a positive offset value, and means for generating a positive offset compared output signal designating a transition of the input signal through the positive offset clock crossover value; and
   means for generating a valid transition signal to route the phase adjustment signal to a clock generation circuit when the positive offset compared output signal transitions over a clock period.

16. The decision-directed phase detector of claim 15, further comprising:
   means for comparing the input signal with the reference signal set to a negative offset clock crossover value of the clock crossover value offset by a negative offset value; and
   means for generating a negative offset compared output signal designating a transition of the input signal through the negative offset clock crossover value.

17. The decision-directed phase detector of claim 16, wherein the means for generating a valid transition signal further comprises means for generating the valid transition signal to route the phase adjustment signal to the clock generation circuit.

18. The decision-directed phase detector of claim 17, further comprising means for receiving both the transition of the positive offset compared output signal and the transition of the negative offset compared output signal over the clock period.

19. The decision-directed phase detector of claim 18, further comprising means for passing one of the phase adjustment signal or a common mode input signal to the clock generation circuit based on the valid transition signal.

20. The decision-directed phase detector of claim 15, wherein the means for generating the phase adjustment signal is an Alexander phase detector.

* * * * *